United States Patent
Lee et al.

(10) Patent No.: US 7,750,564 B2
(45) Date of Patent: Jul. 6, 2010

(54) HIGH EFFICIENCY ORGANIC LIGHT EMITTING DEVICE

(75) Inventors: Sung-Hun Lee, Yongin-si (KR);
Sang-Yeol Kim, Yongin-si (KR);
Mu-Gyeom Kim, Yongin-si (KR);
Pil-Soo Ahn, Yongin-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 380 days.

(21) Appl. No.: 11/819,741

(22) Filed: Jun. 28, 2007

(65) Prior Publication Data
US 2008/0129191 A1 Jun. 5, 2008

(30) Foreign Application Priority Data
Dec. 4, 2006 (KR) ...................... 10-2006-0121789

(51) Int. Cl.
*H01J 1/62* (2006.01)
(52) U.S. Cl. ..................................... 313/506
(58) Field of Classification Search ................. 313/506
See application file for complete search history.

(56) References Cited

U.S. PATENT DOCUMENTS 5,757,139 A * 5/1998 Forrest et al. ............ 315/169.3
6,406,801 B1 * 6/2002 Tokito et al. ................ 313/506
2005/0194896 A1 9/2005 Sugita
2007/0273279 A1 * 11/2007 Kobayashi .................. 313/506

FOREIGN PATENT DOCUMENTS

KR 10-2004-0030359 4/2004

OTHER PUBLICATIONS

Kashiwabara et al., 29.5L: *Late-News Paper: Advanced AM-OLED Display Based on White Emitter With Microcavity Struct6ure*, SID 04 Digest, pp. 1017-1019 (It was displayed at the Society for Information Display (SID) in 2004 by Sony.).
Shiga et al., *Design of Multiwavelength Resonant Cavities for White Organic Light-Emitting Diodes*, Journal of Applied Physics vol. 93, Jan. 1, 2003, pp. 19-22.

* cited by examiner

*Primary Examiner*—P. Macchiarolo
(74) *Attorney, Agent, or Firm*—Robert E. Bushnell, Esq.

(57) ABSTRACT

Provided is an organic light emitting device (OLED) having increased optical extraction efficiency. The OLED includes a transparent substrate, an optical path control layer made of an optical transmittance material on the transparent substrate, a transparent electrode, an organic light emitting layer that generated light, and a reflection electrode formed on the organic light emitting layer, which are sequentially stacked. The refractive index And thickness of the optical path control layer are optimized.

18 Claims, 13 Drawing Sheets

HIGH EFFICIENCY ORGANIC LIGHT EMITTING DEVICE

CLAIM OF PRIORITY

This application makes reference to, incorporates the same herein, and claims all benefits accruing under 35 U.S.C. §119 from an application for HIGH EFFICIENCY ORGANIC LIGHT EMITTING DEVICE earlier filed in the Korean Intellectual Property Office on 4 Dec. 2006 and there duly assigned Ser. No. 10-2006-0121789.

BACKGROUND OF THE INVENTION

1. Field of the Invention

The present invention relates to an organic light emitting device, and more particularly, to an organic light emitting device that has increased light extraction efficiency and improved color reproducibility due to an optical path control layer.

2. Description of the Related Art

Organic light emitting devices (OLEDs) are display devices that display an image using light emitted in processes of radiative recombination of excitons which are formed by combining holes supplied from an anode electrode with electrons supplied from a cathode electrode in the organic light emitting layer. Due to high display characteristics such as wide viewing angle, short response time, thin size, low manufacturing costs, and high contrast, the OLEDs are expected to be the next generation of flat panel display device.

OLEDs can be classified into passive matrix (PM) type OLEDs and active matrix (AM) type OLEDs according to the driving method, and can also be classified into bottom emission type OLEDs and top emission type OLEDs according to the direction of light emission from the organic light emitting layer.

OLEDs display red, green, blue, or white color according to material selection for forming the organic light emitting layer. Of the full color technique of OLED apparatuses, the white color OLED apparatus has an advantage of displaying a high resolution image using a large size mother glass in OLED apparatuses and a color filter technique of conventional liquid crystal displays (LCDs).

An OLED includes a transparent electrode, a light emitting layer, an electron injection layer, and a reflection electrode, which are sequentially stacked on a substrate. The OLED may additionally include layers such as a hole injection layer, a hole transport layer, and an electron transport layer. When voltage is applied between the transparent electrode and the reflection electrode, electrons and holes are combined, and a spectrum of light having a predetermined wavelength is generated from the light emitting layer. A portion of the light emitted from the light emitting layer is emitted to the outside through the transparent electrode. At this point, light having an incident angle greater than a critical angle at an interface of each of the layers cannot be emitted to the outside.

An optical extraction efficiency is a ratio of light extracted to the outside with respect to a total amount of light emitted from the light emitting layer. Most of the photons are trapped in an OLED due to internal reflection or extracted to laterals, and thus, cannot contribute to the optical output of light. Accordingly, the optical extraction efficiency of the OLED is merely approximately 20%. Therefore, research for increasing the optical extraction efficiency is necessary.

In an AM type 12.5-inch OLED display, which that was disclosed in Article No. 29.5L and was displayed at the Society for Information Display (SID) in 2004 by SONY, the color purity and efficiency were improved by employing a cavity effect in a top emission type OLED. RGB pixels having different thicknesses of indium tin oxide (ITO) are formed on a reflection anode. However, in this technique, the manufacturing process is complicated because of the ITO layers having different thicknesses.

In U.S. patent publication No. 2005/0194896 and Korean Patent Publication No. 10-2004-0030359, an optical scattering layer is included to increase optical extraction efficiency. In this technique, a scattering center having a minute structure is employed in a matrix of the optical scattering layer, and the optical extraction efficiency is increased through the scattering of light.

In the published in JAP Vol. 93, 2003, pp. 19 by Takahiro Shiga of Toyota Central Research Center, a technique that can increase optical extraction efficiency of a bottom emission type white OLED was disclosed. In this report, a multi-wavelength micro-cavity structure having two modes using two dielectric mirrors obtained by forming a multi-layered thin film of $ITO/SiO_2/TiO_2$ on a glass substrate has been reported. However, this technique has a complicated manufacturing process, because the multi-layered thin film must be formed on the glass substrate.

SUMMARY OF THE INVENTION

The present invention provides an organic light emitting device (OLED) having a simple structure that can increase the optical extraction efficiency.

According to an aspect of the present invention, there is provided an organic light emitting device including a transparent substrate, a reflection electrode, an organic light emitting layer formed between the transparent substrate and the reflection electrode where the organic light emitting layer emitting light, a transparent electrode formed between the transparent substrate and the organic light emitting layer, and an optical path control layer formed between the transparent substrate and the transparent electrode. The optical path control layer increasing emission of light.

The optical path control layer may be made of a material having an optical transmittance no less than 90% in the visible light region. A difference between refractive indices of the optical path control layer and the transparent electrode may be no greater than 10% in the visible light region. The optical path control layer may have a refractive index in a range from 1.6 to 2.4 in the visible light region.

The organic light emitting layer may include a red color light emitting layer, a green color light emitting layer, and a blue color light emitting layer. A white color is produced by mixing the lights emitted from the red color light layer, a green color light emitting layer, and a blue color light emitting layer. The organic light emitting layer may include at least two light emitting layers, one of which generates a first color, and another of which generates a second color that is a complementary color of the first color. The organic light emitting layer may include a light emitting layer that generates a single color.

A sum of thicknesses of the transparent electrode and the optical path control layer ranges from 400 nm to 900 nm.

The optical path control layer may be made of a material such as an organic material, an oxide material, a nitride material, a sulfide material, or combinations thereof. The optical path control layer may be made of a material such as $Al_2O_3$, BaO, MgO, $HfO_2$, $ZrO_2$, $CaO_2$, $SrO_2$, $Y_2O_3$, $Si_3N_4$, AlN, GaN, ZnS, CdS, or combinations thereof.

According to another aspect of the present invention, there is provided an organic light emitting device including a substrate, an optical path control layer for increasing emission of light, a reflection electrode formed between the substrate and the optical path control layer, an organic light emitting layer formed between the reflection electrode and the optical path control layer where the organic light emitting layer emitting light, and a transparent electrode formed between the organic light emitting layer and the optical path control layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
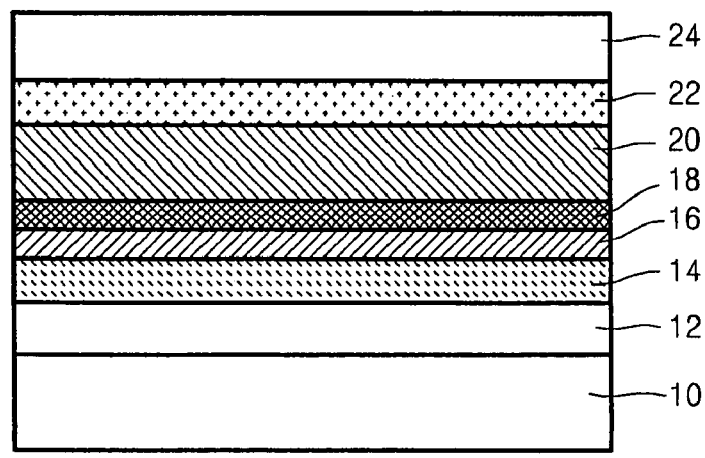
FIG. 1 is a schematic cross-sectional view illustrating the structure of an organic light emitting device (OLED)

The present invention will now be described more fully with reference to the accompanying drawings in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the thicknesses of layers and regions are exaggerated for clarity, and like reference numerals refer to the like elements.

FIG. 1 is a cross-sectional view illustrating a structure of an organic light emitting device (OLED). The OLED includes transparent electrode 12, hole injection layer 14, hole transport layer 16, light emitting layer 18, electron transport layer 20, electron injection layer 22, and reflection electrode 24, which are sequentially stacked on substrate 10. When voltage is applied between transparent electrode 12 and reflection electrode 24, electrons and holes are combined, and a spectrum of light having a predetermined wavelength is generated from light emitting layer 18. A portion of the light emitted from light emitting layer 18 is emitted to the outside through transparent electrode 12.

Figure 2:
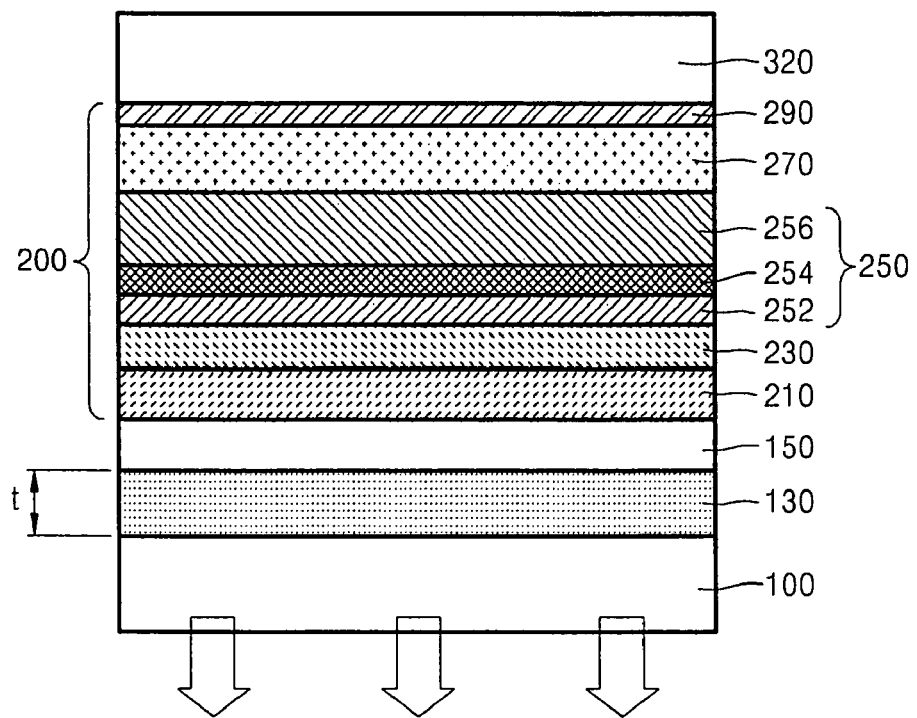
FIG. 2 is a schematic cross-sectional view illustrating the structure of an OLED constructed as an embodiment of the present invention.

FIG. 2 is a schematic cross-sectional view illustrating the structure of an OLED constructed as to an embodiment of the present invention. Referring to FIG. 2, the OLED includes substrate 100, transparent electrode 150, organic light emitting layer 200, reflection electrode 320, and optical path control layer 130 provided between transparent electrode 150 and substrate 100.

Substrate 100 can be a glass substrate. Transparent electrode 150 works as an anode electrode that supplies holes to organic light emitting layer 200, and can be formed of a material having high optical transmittance such as indium tin oxide (ITO) or indium zinc oxide (IZO).

Organic light emitting layer 200 includes light emitting layer 250 that can include more than one layer that generates light. In the present embodiment, organic light emitting layer 200 has a structure, in which hole injection layer 210, hole transport layer 230, light emitting layer 250, electron transport layer 270, and electron injection layer 290 are sequentially stacked. Light emitting layer 250 includes blue color light emitting layer 252, green color light emitting layer 254, and red color light emitting layer 256.

Optical path control layer 130 is formed to increase the emission of light from the OLED to the outside, and can be formed of a light transmittance material such as an organic material, an oxide material, a nitride material, or a sulfide material. That is, optical path control layer 130 can be formed of a material or a combination of materials such as $Al_2O_3$, BaO, MgO, $HfO_2$, $ZrO_2$, $CaO_2$, $SrO_2$, $Y_2O_3$, $Si_3N_4$, AlN, GaN, ZnS, or CdS. The optical transmittance of optical path control layer 130 may be approximately 90% or more in the visible light region. Also, the difference between refractive indices of optical path control layer 130 and transparent electrode 150 can be approximately 10% or less. Considering the refractive index of transparent electrode 150, optical path control layer 130 may have a refractive index in a range from 1.6 to 2.4 in the visible light region. Herein, the refractive index in the visible light region refers to the refractive index at a wavelength of 590 nm.

Reflection electrode 320 acts as a cathode electrode that supplies electrons to organic light emitting layer 200, and can be formed of a high reflective metal, for example, aluminum.

The reason that the OLED constructed according to the principles of the present embodiment has increased light emission characteristics will now be briefly described.

When voltage is applied between transparent electrode 150 and reflection electrode 320, excitons are formed in light emitting layer 250 through combination of holes supplied from transparent electrode 150, which acts as an anode electrode, with electrons supplied from reflection electrode 320, which acts as a cathode electrode. Light is generated from light emitting layer 250 when the excitons are radiatively recombined. Since a distance between the location where the excitons are formed and reflection electrode 320 is shorter than the wavelength of the generated light, the distribution of light of a particular wavelength or an emission direction of light is greatly affected by optical interference. Also, because the thickness of each of the layers that is included in organic light emitting layer 200 is as small as wavelength of the generated light, the light generated as described above must satisfy conditions related to reflection, transmittance, and interference of a multilayer at an interface of each of the layers in order to be finally emitted to the outside from the OLED.

At this point, substrate 100 formed of glass has a refractive index of 1.5, and the layers that are included in the organic light emitting layer 200 have similar refractive indices, which is approximately 1.6 to 1.8, and is not greatly different from the refractive index (1.8 to 2.2) of transparent electrode 150. Hence, the OLED can be modeled as a simplified weak micro cavity. Substrate 100, which has the largest refractive index difference from transparent electrode 150, is considered as a partial reflection mirror, and reflection electrode 320, which acts as a cathode electrode, is considered as a total reflection mirror. In the present embodiment, optical path control layer 130 is employed to optimize the length of the cavity, and the reflectivity and transmittance of the partial reflection mirror. Optical path control layer 130 can contribute to the increase in the emission of light by appropriately selecting the thickness and the refractive index, which will be described in detail using experimental data and computational data later.

Figure 3:
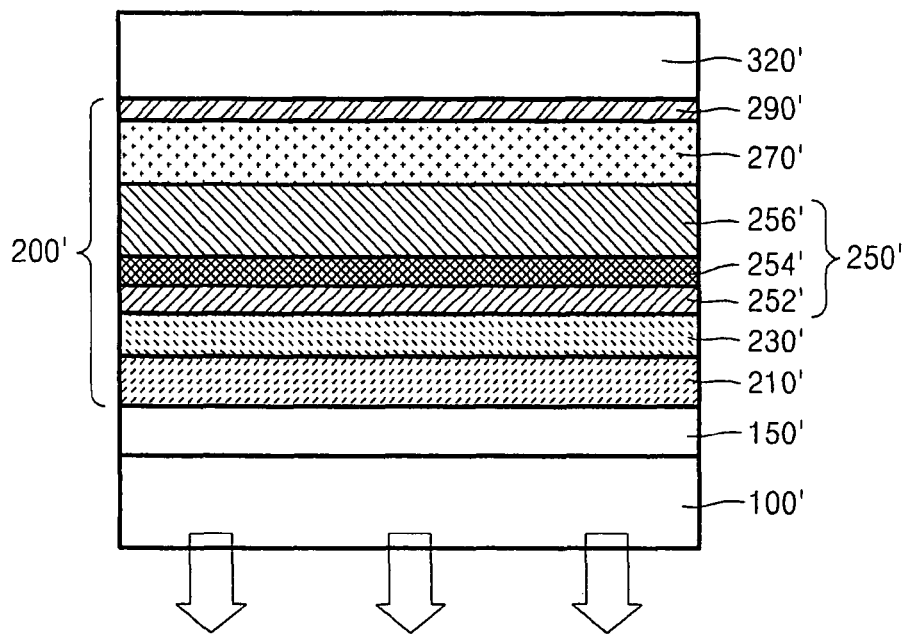
FIG. 3 is a schematic cross-sectional view of an OLED constructed as a comparative example for comparing the characteristics thereof with the characteristics of the OLED of FIG. 2, which is constructed as an embodiment of the present invention.

FIG. 3 is a schematic cross-sectional view of an OLED constructed for a comparative example for comparing the characteristics thereof with respect to the OLED of FIG. 2, which is constructed as an embodiment of the present invention. The structure of the OLED of FIG. 3 is the same as the structure of the OLED of FIG. 2 except that the OLED of FIG. 3 does not have an optical path control layer. In other words, the OLED of FIG. 3 includes substrate 100', transparent electrode 150', organic light emitting layer 200', and reflection electrode 320'. Organic light emitting layer 200' includes hole injection layer 210', hole transport layer 230', light emitting layer 250', electron transport layer 270', and electron injection layer 290'. Light emitting layer 250' includes blue color light emitting layer 252', green color light emitting layer 254', and red color light emitting layer 256'.

The actual manufacturing process and the practical dimensions of the OLED according to the present invention are as follows. Substrate 100 is a glass substrate having a thickness of 0.7 mm, and optical path control layer 130 is deposited to a thickness of 750 nm using SiNx on substrate 100. Next, transparent electrode 150 is formed to a thickness of 90 nm using IZO on optical path control layer 130, and is patterned in a predetermined shape. After transparent electrode 150 is sequentially washed using a neutral detergent, deionized water, and isopropyl alcohol, transparent electrode 150 is UV-ozone treated. After hole injection layer 210, hole transport layer 230, blue color light emitting layer 252, green color light emitting layer 254, red color light emitting layer 256, and electron transport layer 270 are sequentially stacked, electron injection layer 290 is deposited to a thickness of 1 nm using LiF on electron transport layer 270. Next reflection electrode 320 is deposited to a thickness of 150 nm using aluminum, and the resultant product is encapsulated under a nitrogen atmosphere.

The OLED of the comparative example is manufactured using the same method as described above except that a SiNx layer (optical path control layer) is not deposited on the glass substrate.

Figure 4:
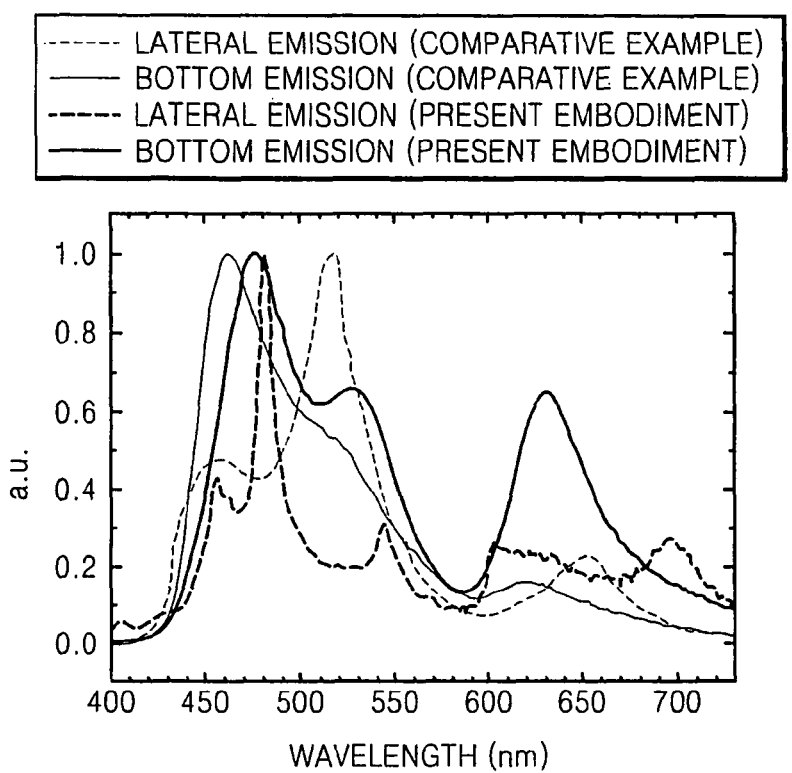
FIG. 4 is a graph showing light emission spectrums of the OLED of FIG. 2 and the OLED of FIG. 3.

FIG. 4 is a graph showing light emission spectrums of the OLED of FIG. 2 and the OLED of FIG. 3, which shows the amounts of bottom-emission light and lateral-emission light. FIG. 4 shows the reason that the OLED of FIG. 2 has high optical extraction efficiency. The spectrums measured in a vertical direction to the substrate indicate the bottom-emission light and the spectrums measured at a lateral of the substrate indicate the lateral-emission light. Referring to the graphs, in the case of the OLED that does not have the optical path control layer, the amount of the lateral-emission light is greater than that of the bottom-emission light in green and red color regions. That is, the OLED of FIG. 3 has low light extraction efficiency since light is guided within the substrate instead of being emitted through the bottom substrate. In the case of the OLED having optical path control layer 130, the amount of lateral-emission light is less than that in the OLED that does not have the optical path control layer, and accordingly, the amount of bottom-emission light is greater than the lateral-emission light in the red, green, and blue color regions. This result indicates that the length of the cavity is optimized due to the inclusion of optical path control layer 130, and thus, the number of the emission modes of light is increased.

The optical extraction efficiency defined by the brightness over current density is measured as 9.2 cd/A in the OLED of FIG. 2 and 7 cd/A in the OLED of FIG. 3 on a brightness basis of 6000 cd/m$^2$. That is, the optical extraction efficiency of the OLED according to the present embodiment is higher than that of the OLED of the comparative example.

The optical characteristics of the OLED having optical path control layer 130 with thicknesses t of 750 nm and 660 nm will now be described with reference to FIGS. 5 through 14 which are drawn basis on computational modeling data.

Figure 5:
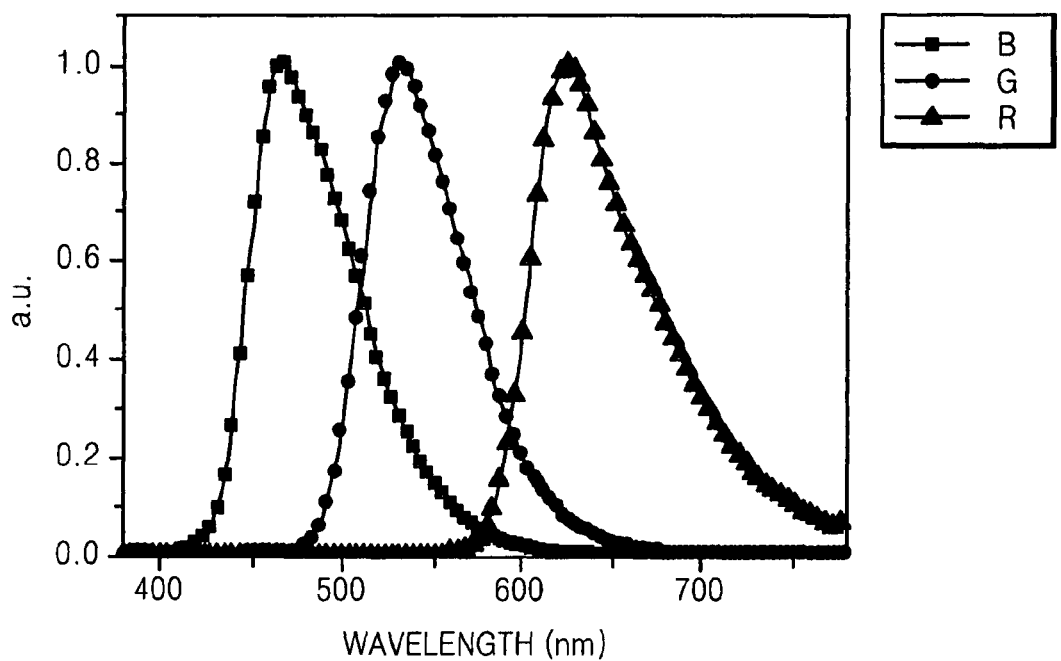
FIG. 5 is a graph showing internal light emitting spectrums of R (red), G (green), and B (blue) light generated in a red light emitting layer, a green light emitting layer, and a blue light emitting layer, respectively.

FIG. 5 is a graph showing internal light emitting spectrums of R (red), G (green), B (blue) light generated in a red light emitting layer, a green light emitting layer, and a blue light emitting layer, respectively.

Figure 6A:
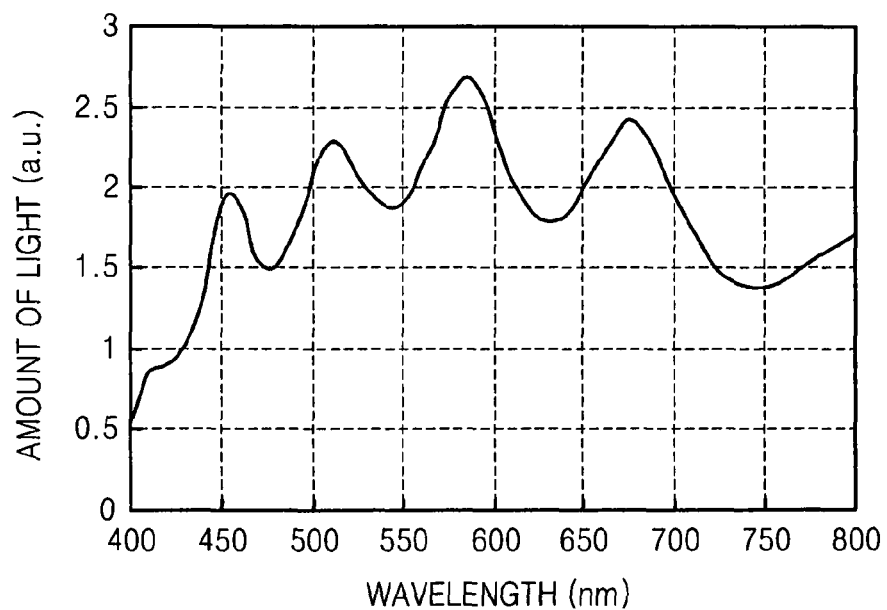
FIGS. 6A through 6C are graphs showing computational results of amounts of light emitted to the outside from a blue light emitting layer, a green light emitting layer, and a red light emitting layer, respectively, assuming that an identical point light source is located on the blue light emitting layer, the green light emitting layer, and the red light emitting layer, when an optical path control layer has a thickness of 750 nm.
Figure 6B:
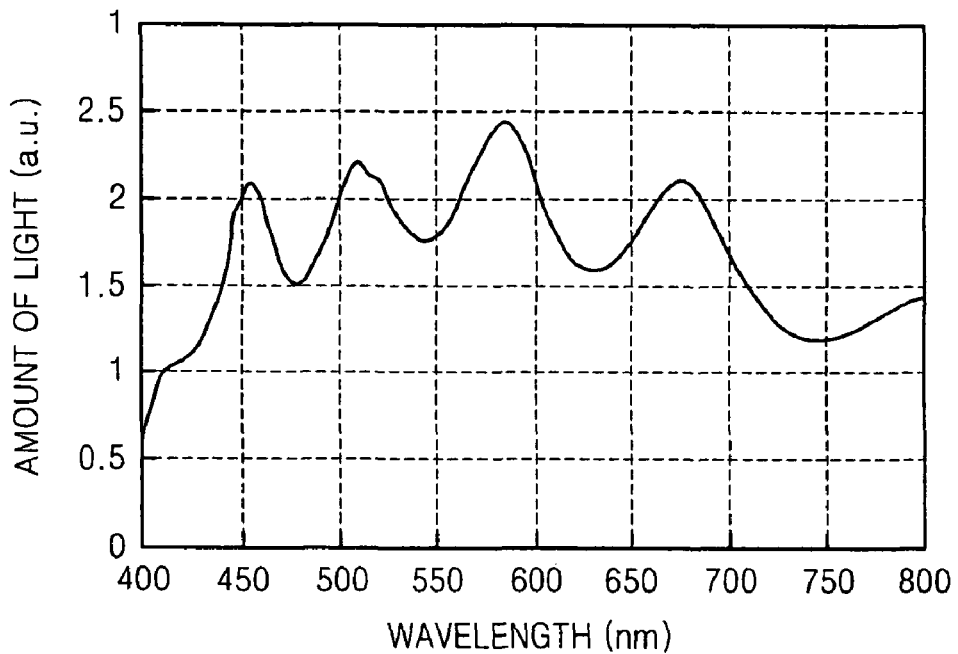
Figure 6C:
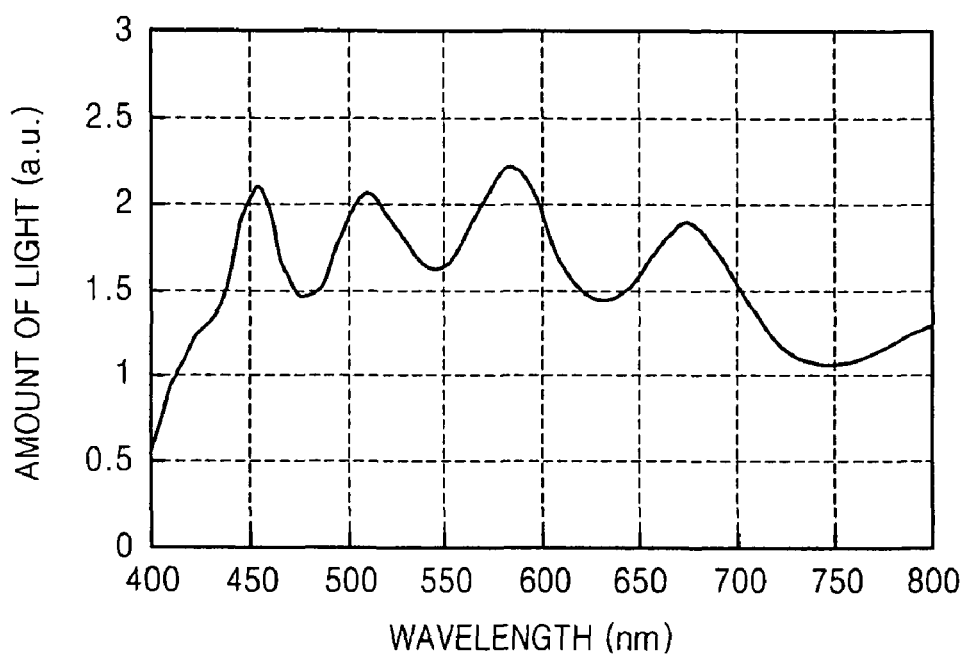
Figure 7A:
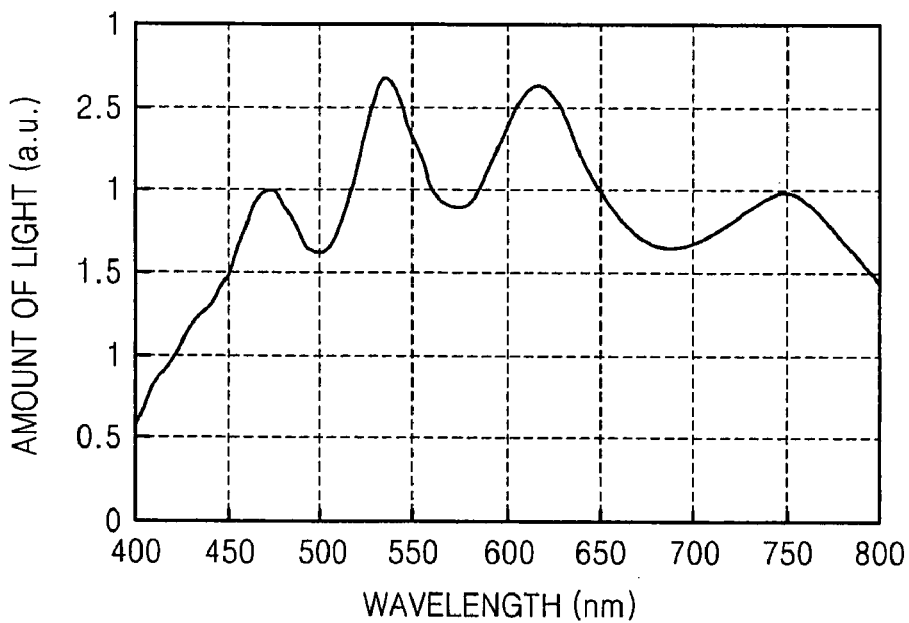
FIGS. 7A through 7C are graphs showing computational results of amounts of light emitted to the outside from a blue light emitting layer, a green light emitting layer, and a red light emitting layer, respectively, assuming that an identical point light source is located on the blue light emitting layer, the green light emitting layer, and the red light emitting layer, when an optical path control layer has a thickness of 660 nm.
Figure 7B:
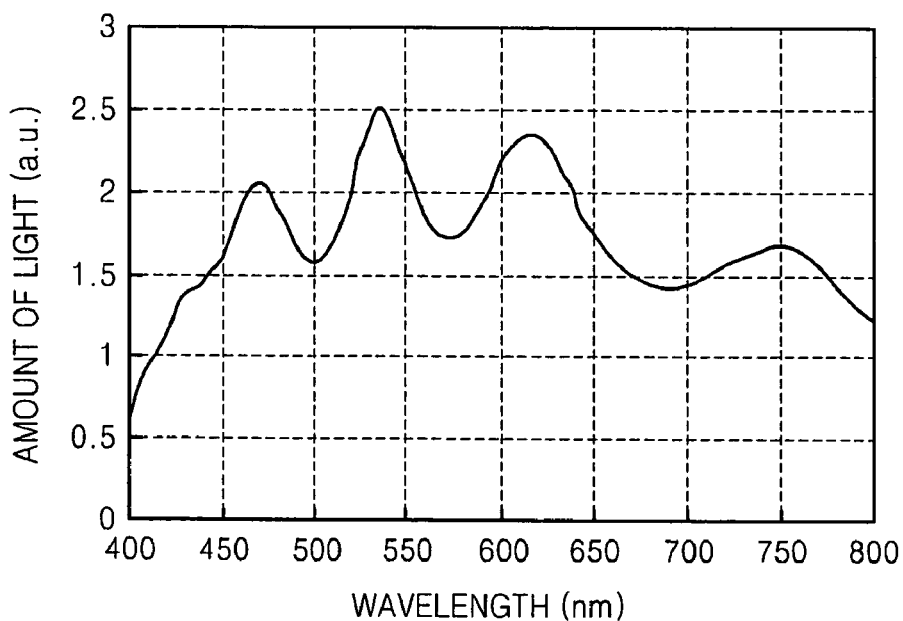
Figure 7C:
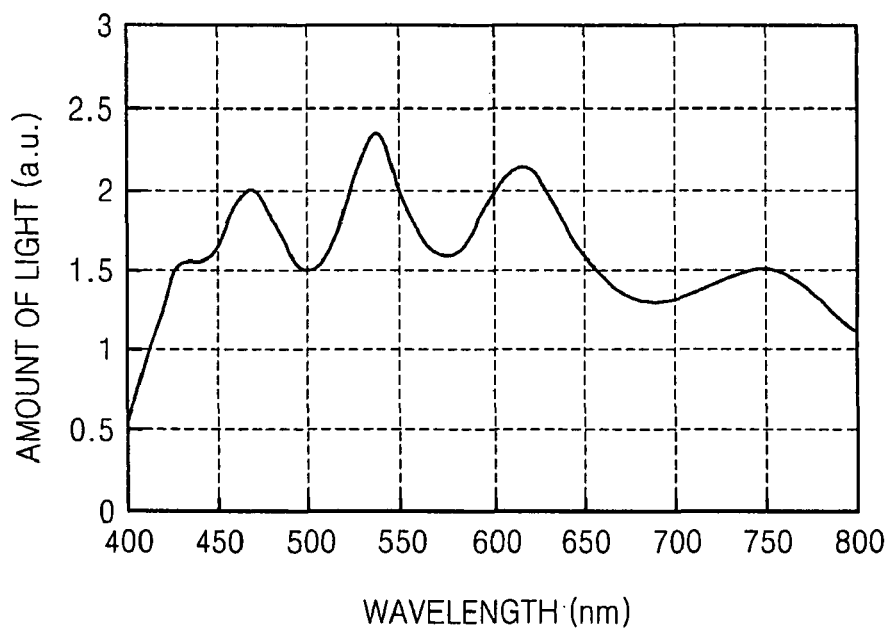

FIGS. 6A through 6C are graphs showing computational results of amounts of light emitted to the outside from a blue light emitting layer, a green light emitting layer, and a red light emitting layer assuming that an identical point light source is located on the blue light emitting layer, the green light emitting layer, and the red light emitting layer, when an optical path control layer has a thickness of 750 nm. FIGS. 7A through 7C are graphs showing computational results of amounts of light emitted to the outside from a blue light emitting layer, a green light emitting layer, and a red light emitting layer assuming that an identical point light source is located on the blue light emitting layer, the green light emitting layer, and the red light emitting layer, when an optical path control layer has a thickness of 660 nm. Referring to graphs, considering the wavelengths of R, G, and B light regions are 620 nm to 630 nm, 520 nm to 530 nm, and 460 nm to 470 nm, respectively, it is shown that the amounts of light emitted in the R, G, and B light regions increase approximately 10% when the optical path control layer has a thickness of 660 nm.

Figure 8:
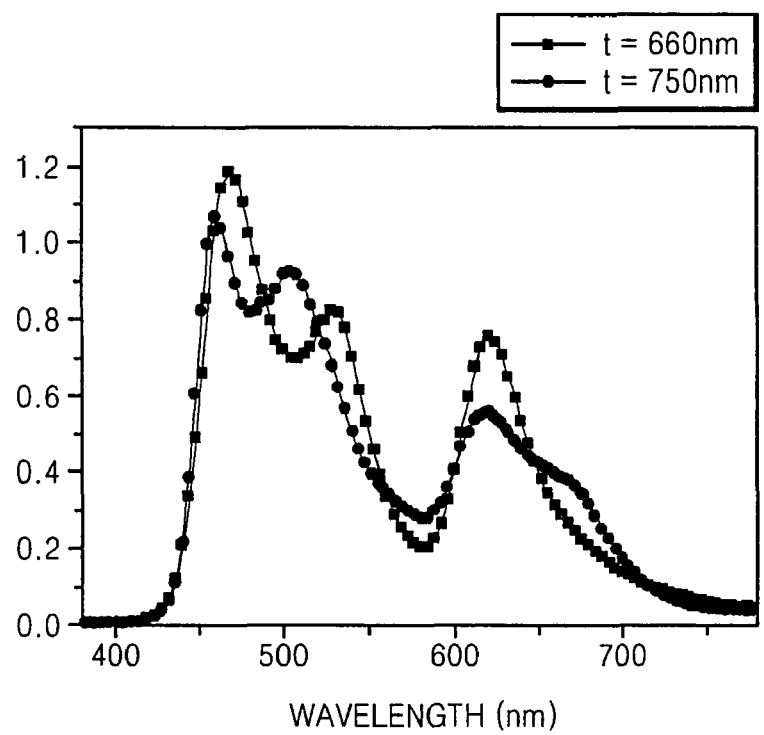
FIG. 8 is a graph showing computational results of external light emitting spectrums obtained from the R, G, and B light internal light emitting spectrums of FIG. 5 and the external light emitting spectrums of FIGS. 6A through 7C.

FIG. 8 is a graph showing computational results of external light emitting spectrums obtained by multiplying the internal light emitting spectrums of R, G, and B lights of FIG. 5 in a ratio of 3.1:1.4:5.5 to the data of graphs in FIGS. 6A through 7C. Here, since the data in FIG. 5 is normalized, the ratio can be multiplied to the data in FIG. 5 so that the internal light emitting spectrums can match up the characteristics of the actually manufactured light emitting layer. Referring to the graphs in FIG. 8, it is clearly shown that the OLED having the optical path control layer with a thickness of 660 nm has greater amount of light emission than the OLED having the optical path control layer with a thickness of 750 nm.

Figure 9A:
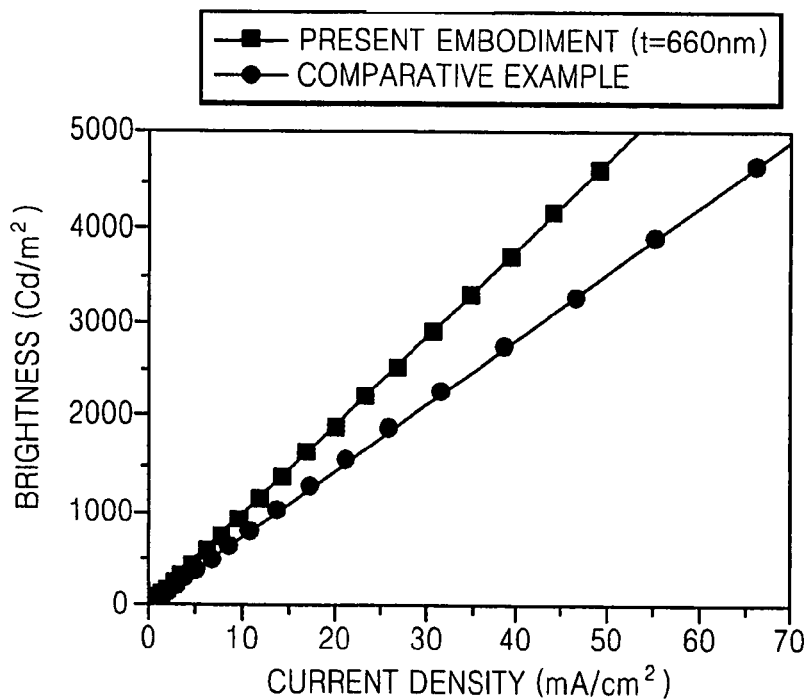
FIGS. 9A and 9B are graphs showing computational results of brightness and efficiency of an OLED having an optical path control layer with a thickness of 660 nm and an OLED without an optical path control layer.
Figure 9B:
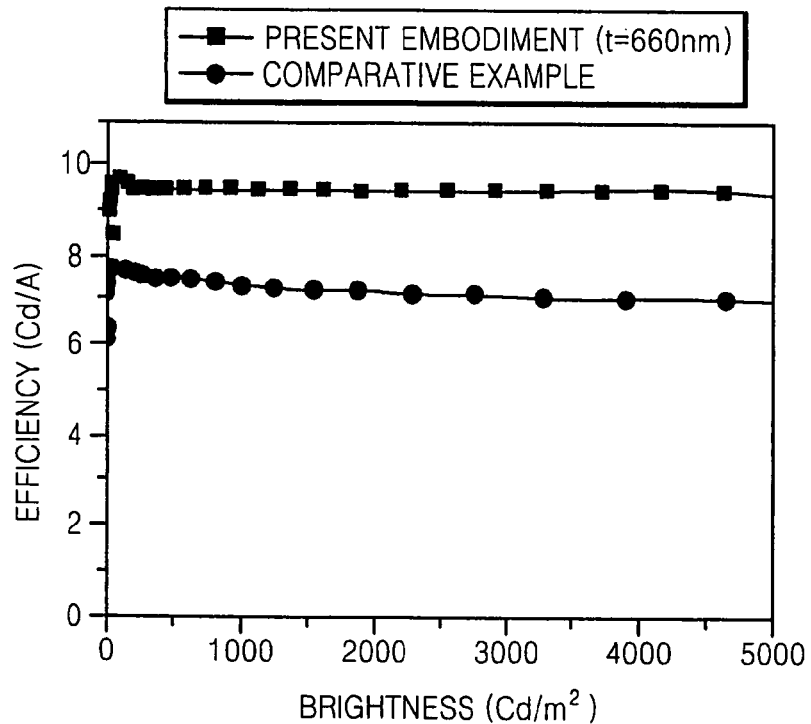

FIGS. 9A and 9B are graphs showing computational results of brightness and efficiency of an OLED having an optical path control layer with a thickness of 660 nm and an OLED that does not have an optical path control layer. Referring to FIGS. 9A and 9B, in the case of the OLED having the optical path control layer with a thickness of 660 nm, it is shown that optical extraction efficiency defined by the ratio of brightness to current density is approximately 9 cd/A or more, which is higher than that of the OLED that does not have the optical path control layer 130.

Figure 10:
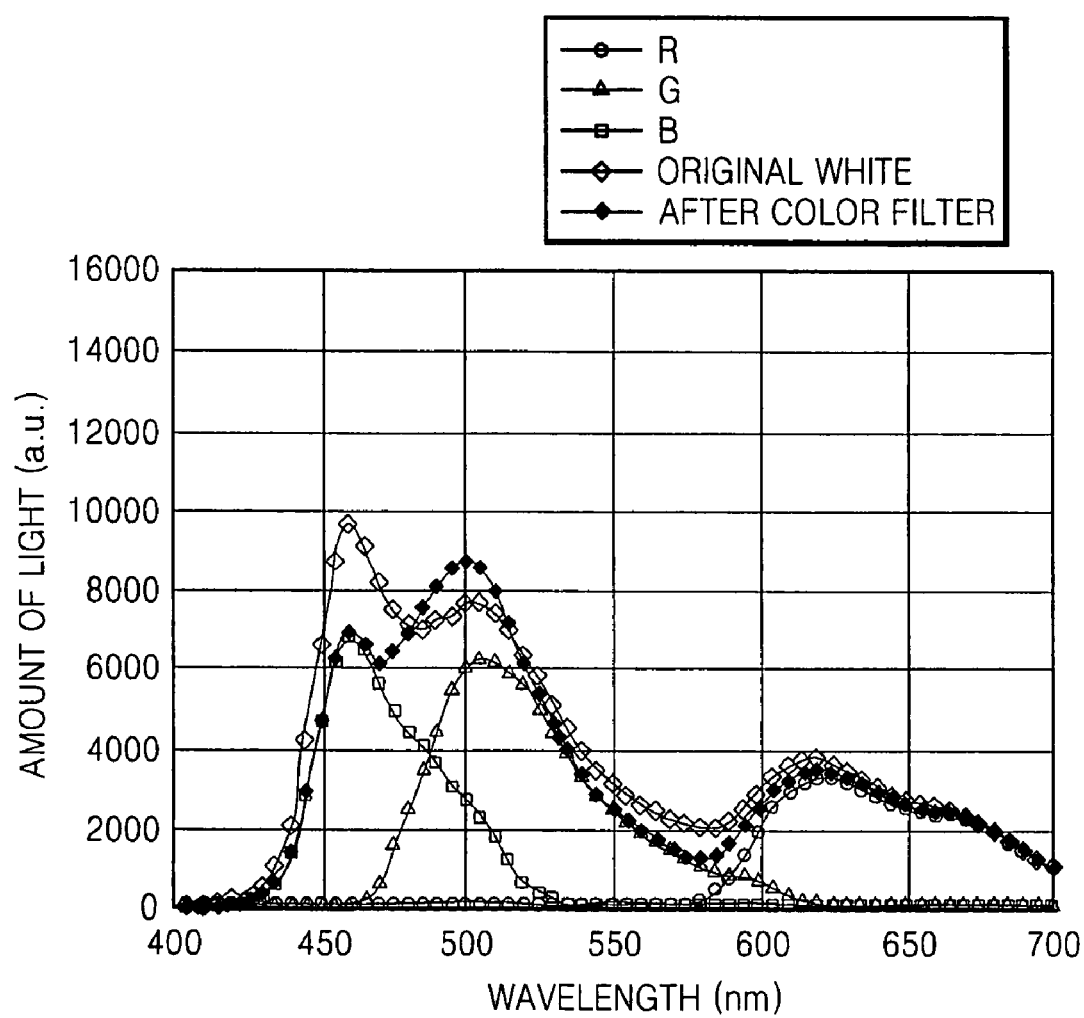
FIG. 10 is a graph showing color reproducibility of an OLED having an optical path control layer with a thickness of 750 nm.
Figure 11:
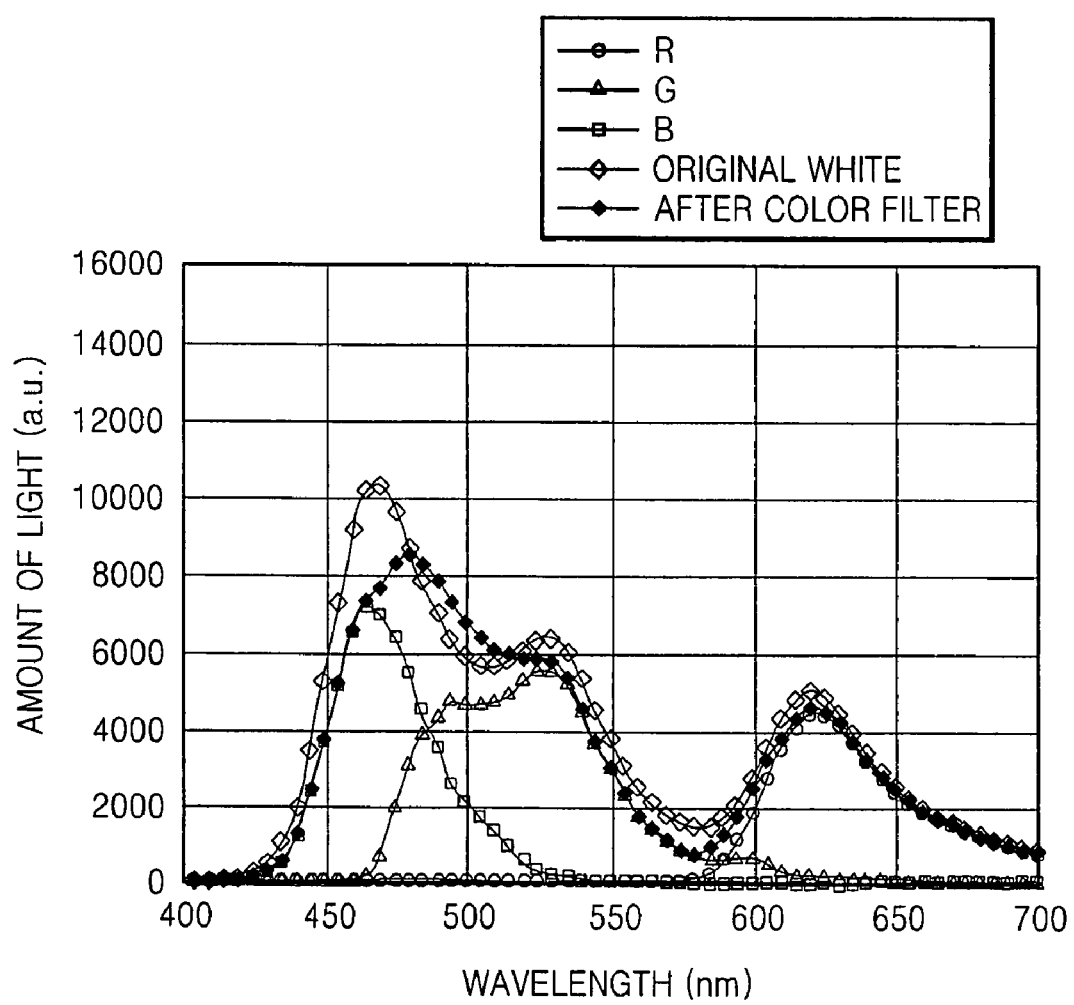
FIG. 11 is a graph showing color reproducibility of an OLED having an optical path control layer with a thickness of 660 nm.

FIGS. 10 and 11 are graphs of computational results of color reproducibility spectrums obtained by multiplying transmittances of color filters of each of the R, G, and B lights to the external light emission spectrum of FIG. 8 with respect to OLEDs having optical path control layers with a thickness of 750 nm and 660 nm, respectively.

Figure 12:
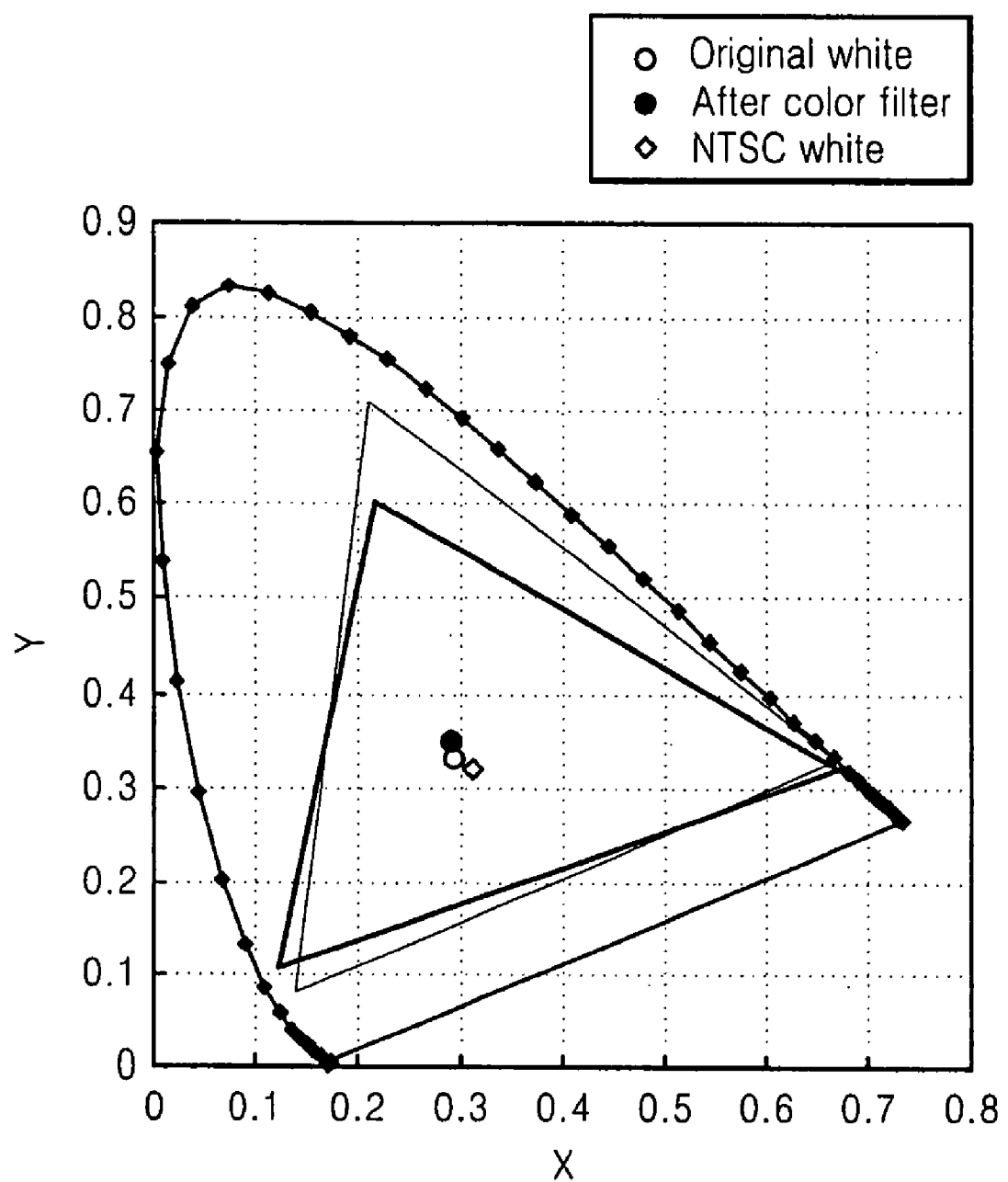
FIGS. 12 through 14 are color coordinate graphs of an OLED having an optical path control layer with a thickness of 660 nm, an OLED having an optical path control layer with a thickness of 750 nm, and an OLED that does not have an optical path control layer, respectively.
Figure 13:
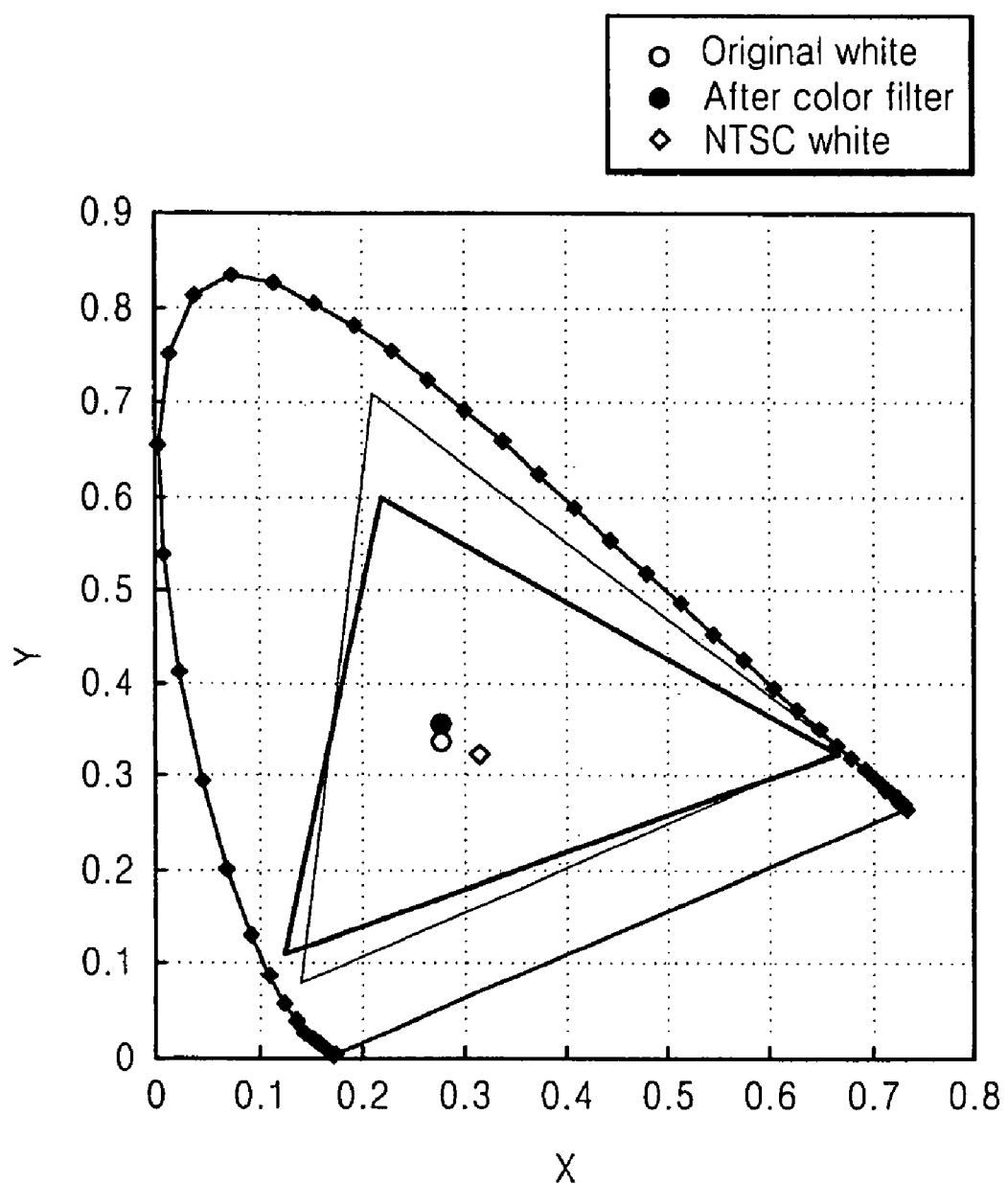
Figure 14:
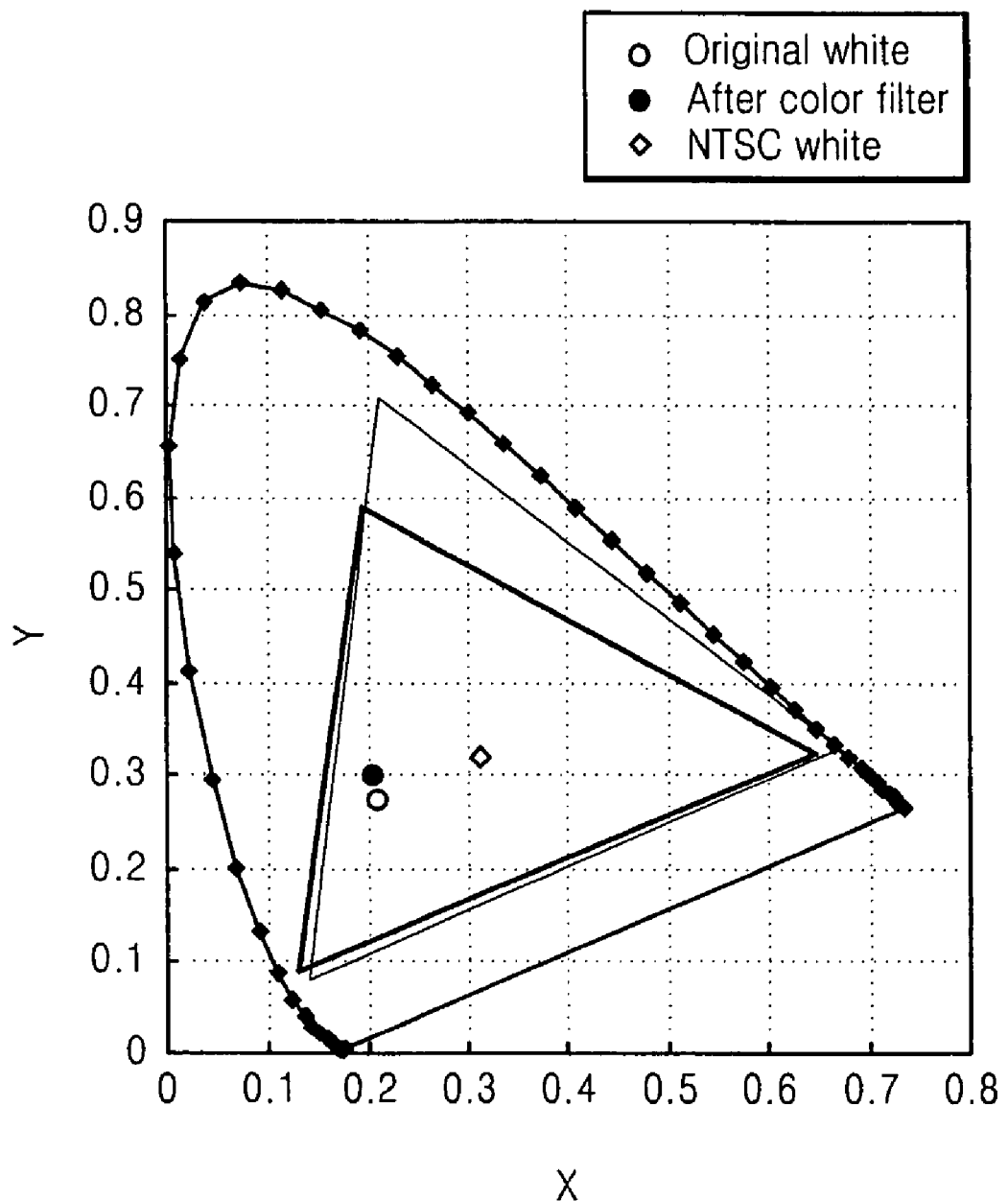

FIGS. 12 through 14 are color coordinate graphs of an OLED having an optical path control layer with a thickness of 660 nm, an OLED having an optical path control layer with a thickness of 750 nm, and an OLED that does not have an optical path control layer. In each of the graphs of FIGS. 12 through 14, a national television system committee (NTSC) color coordinate is indicated, and an outer triangle in each graph represents the NTSC color coordinate.

Tables 1 through 3 show results of calculated color coordinates of the OLED of the present embodiments and the OLED of the comparative example from the color coordinate graphs of FIGS. 12 through 14.

TABLE 1

|  |  | x | Y |
|---|---|---|---|
| original | W | 0.293 | 0.333 |
| color filter | W | 0.292 | 0.351 |
|  | R | 0.672 | 0.321 |
|  | G | 0.217 | 0.602 |
|  | B | 0.123 | 0.351 |

TABLE 2

|  |  | x | Y |
|---|---|---|---|
| original | W | 0.285 | 0.330 |
| color filter | W | 0.281 | 0.351 |
|  | R | 0.668 | 0.324 |
|  | G | 0.219 | 0.598 |
|  | B | 0.124 | 0.111 |

TABLE 3

|  |  | x | Y |
|---|---|---|---|
| original | W | 0.209 | 0.274 |
| color filter | W | 0.203 | 0.300 |
|  | R | 0.647 | 0.324 |
|  | G | 0.195 | 0.591 |
|  | B | 0.129 | 0.089 |

Table 4 shows results of color reproducibility range of the OLED having an optical path control layer with a thickness of 660 nm, the OLED having an optical path control layer with a thickness of 750 nm, and the OLED that does not have the optical path control layer from the R. G.B. light coordinate.

TABLE 4

|  | Color reproducibility range to NTSC (%) |
|---|---|
| Embodiment (t = 660 nm) | 79.6 |
| Embodiment (t = 750 nm) | 77.4 |
| Comparative Example | 77.2 |

Referring to Table 4, the OLED having an optical path control layer with a thickness of 660 nm has a color reproducibility range of 79.6% with respect to the NTSC color coordinate, which is higher than that of the OLED that does not have the optical path control layer. Also, the OLED having an optical path control layer with a thickness of 660 nm has a higher color reproducibility than the OLED having an optical path control layer with a thickness of 750 nm. In a white OLED, the sum of thickness of optical path control layer 130 and thickness of transparent electrode 150 may be in a range from 400 nm to 900 nm in consideration of both a two-wavelength type OLED and a three-wavelength type OLED. When the sum of the thicknesses of optical path control layer 130 and transparent electrode 150 is between 400 nm to 900 nm, two or three cavity modes can be designed in consideration of the thickness of the organic layer.

The designing data for the experiments and computational models described above are, examples, and accordingly, various data can be applied. For example, a bottom emission type OLED, in which an anode electrode formed on the rear of the OLED is a transparent electrode, has been described. The present invention, however, can also be applied to a top emission type OLED, in which a cathode electrode is a transparent electrode. Also, a three-wavelength white color OLED in which the light emitting layer consists of a red color light emitting layer, a green color light emitting layer, and a blue color light emitting layer has been described. The stacking sequence of the three light emitting layers, however, can be changed, or the present invention can also be applied to a two-wavelength white color OLED that uses complementary colors to realize a white color. The two-wavelength white color OLED may have two light emitting layers, one of which generates a first color, and another of which generates a second color that is a complementary color of the first color. Also, the present invention can be applied to an OLED that emits a single color by including one of the three light emitting layers. In each of the cases described above, the optical path control layer can be formed to an optimum thickness suitable for maximizing the amount of light in each emission mode.

Figure 15:
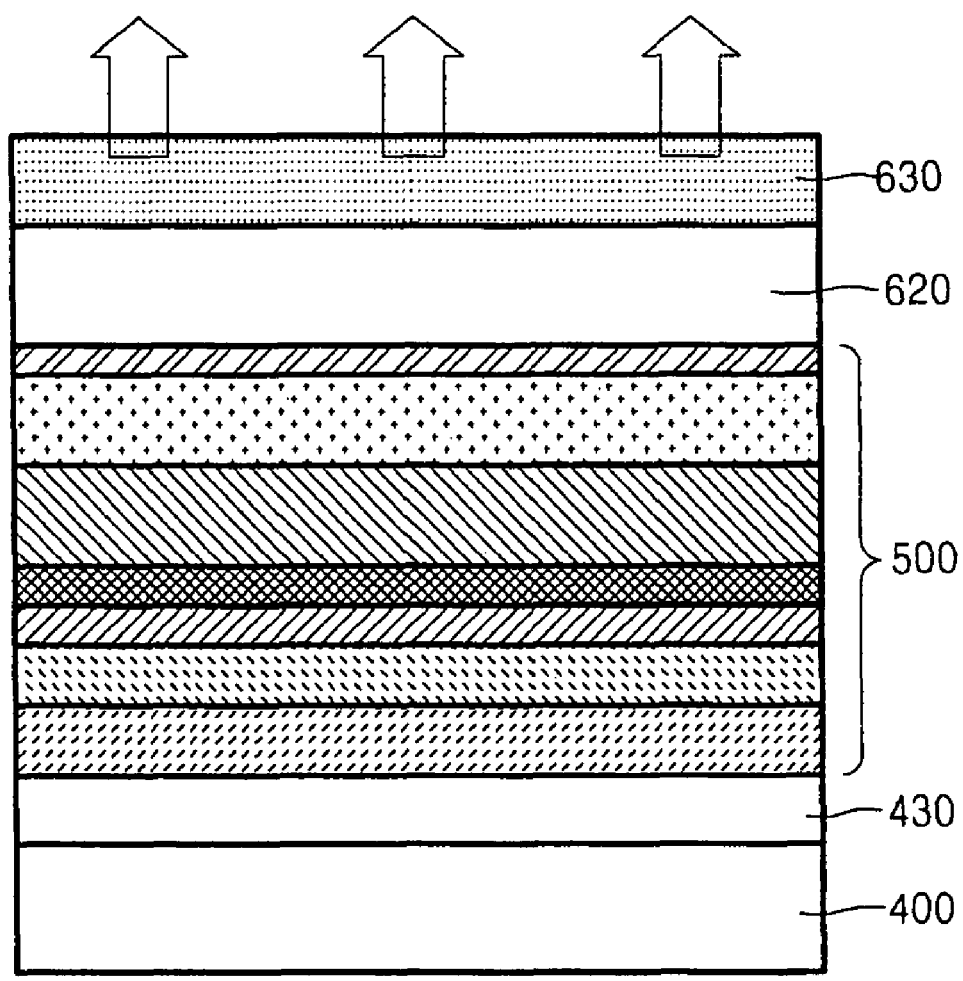
FIG. 15 is a schematic cross-sectional view illustrating a structure of an OLED constructed as another embodiment of the present invention.

FIG. 15 is a schematic cross-sectional view illustrating a structure of a top emission type OLED having optical path control layer 630 constructed as another embodiment of the present invention. The OLED includes reflection electrode 430, organic light emitting layer 500, transparent electrode 620, and optical path control layer 630, which are sequentially stacked on substrate 400. The OLED of FIG. 15 is structured to emit light generated in organic light emitting layer 500 to the top side through transparent electrode 620 unlike in the OLED of FIG. 2 in which light is emitted to the bottom side. Optical path control layer 630 is formed to increase the emission of light from the OLED to the outside, and is formed of a light transmittance material such as an organic material, an oxide material, a nitride material, or a sulfide material. That is, optical path control layer 630 can be formed of a material or a combination of at least two materials such as $Al_2O_3$, BaO, MgO, $HfO_2$, $ZrO_2$, $CaO_2$, $SrO_2$, $Y_2O_3$, $Si_3N_4$, AlN, GaN, ZnS, or CdS. The optical transmittance of optical path control layer 630 may be approximately 90% or more in the visible light region. Also, the refractive index difference between optical path control layer 630 and transparent electrode 620 may be approximately 10% or less. Considering the refractive index of transparent electrode 620, optical path control layer 630 may have a refractive index in a range from 1.6 to 2.4 in the visible light region. The reason that the OLED having optical path control layer 630 has an increased light emission characteristic is substantially the same as described with reference to FIG. 2.

An OLED constructed according to the principles of the present invention can increase optical extraction efficiency and color reproducibility by including an optical path control layer with an appropriate thickness.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting device comprising:
   a transparent substrate;
   a reflection electrode;
   an organic light emitting layer formed between the transparent substrate and the reflection electrode, the organic light emitting layer emitting light;
   a transparent electrode formed between the transparent substrate and the organic light emitting layer; and
   an optical path control layer formed between the transparent substrate and the transparent electrode, the optical path control layer increasing emission of light, a difference between refractive indices of the optical path control layer and the transparent electrode being no greater than 10% in the visible light region.

2. The organic light emitting device of claim 1, comprised of the optical path control layer being made of a material having an optical transmittance no less than 90% in the visible light region.

3. The organic light emitting device of claim 1, comprised of the optical path control layer having a refractive index in a range from 1.6 to 2.4 in the visible light region.

4. The organic light emitting device of claim 1, comprised of the organic light emitting layer comprising a red color light emitting layer, a green color light emitting layer, and a blue color light emitting layer, wherein a white color being produced by mixing the lights emitted from the red color light layer, a green color light emitting layer, and a blue color light emitting layer.

5. The organic light emitting device of claim 1, wherein a sum of thicknesses of the transparent electrode and the optical path control layer ranges from about 400 nm to about 900 nm.

6. The organic light emitting device of claim 1, comprised of the organic light emitting layer comprising at least two light emitting layers, one of which generates a first color, and another of which generates a second color that is a complementary color of the first color.

7. The organic light emitting device of claim 6, wherein the sum of thicknesses of the transparent electrode and the optical path control layer ranges from about 400 nm to about 900 nm.

8. The organic light emitting device of claim 1, wherein the organic light emitting layer comprises a light emitting layer that generates a single color.

9. The organic light emitting device of claim 1, wherein the optical path control layer is made of a material selected from the group consisting of an organic material, an oxide material, a nitride material, a sulfide material, and combinations thereof.

10. The organic light emitting device of claim 9, wherein the optical path control layer is made of a material selected from the group consisting of $Al_2O_3$, BaO, MgO, $HfO_2$, $ZrO_2$, $CaO_2$, $SrO_2$, $Y_2O_3$, $Si_3N_4$AlN, GaN, ZnS, CdS, and combinations thereof.

11. An organic light emitting device comprising:
    a substrate;
    an optical path control layer for increasing emission of light;
    a reflection electrode formed between the substrate and the optical path control layer;
    an organic light emitting layer formed between the reflection electrode and the optical path control layer, the organic light emitting layer emitting light; and
    a transparent electrode formed between the organic light emitting layer and the optical path control layer, a difference between refractive indices of the optical path control layer and the transparent electrode being no greater than 10% in the visible light region.

12. The organic light emitting device of claim 11, comprised of the optical path control layer being made of a material having an optical transmittance no less than 90% in the visible light region.

13. The organic light emitting device of claim 11, comprised of the optical path control layer having a refractive index in a range from 1.6 to 2.4 in the visible light region.

14. The organic light emitting device of claim 11, comprised of the organic light emitting layer comprising a red color light emitting layer, a green color light emitting layer, and a blue color light emitting layer, wherein a white color being produced by mixing the lights emitted from the red color light layer, a green color light emitting layer, and a blue color light emitting layer.

15. The organic light emitting device of claim 11, comprised of the organic light emitting layer comprising at least two light emitting layers, one of which generates a first color, and another of which generates a second color that is a complementary color of the first color.

16. The organic light emitting device of claim 11, wherein the organic light emitting layer comprises a light emitting layer that generates a single color.

17. The organic light emitting device of claim 11, wherein the optical path control layer is made of a material selected from the group consisting of an organic material, an oxide material, a nitride material, a sulfide material, and combinations thereof.

18. The organic light emitting device of claim 17, wherein the optical path control layer is made of a material selected from the group consisting of $Al_2O_3$, BaO, MgO, $HfO_2$, $ZrO_2$, $CaO_2$, $SrO_2$, $Y_2O_3$, $Si_3N_4$, AlN, GaN, ZnS, CdS, and combinations thereof.

* * * * *